(12) United States Patent
Ishii et al.

(10) Patent No.: US 6,527,909 B2
(45) Date of Patent: Mar. 4, 2003

(54) PLASMA PROCESSING APPARATUS

(75) Inventors: Nobuo Ishii, Amagasaki (JP);
Yasuyoshi Yasaka, 5-107, Sudome, Kohata, Uji-Shi, Kyoto-Fu (JP)

(73) Assignees: Tokyo Electron Limited, Tokyo (JP); Yasuyoshi Yasaka, Kyoto-Fu (JP); Makoto Ando, Kanagawa-ken (JP)

( * ) Notice: Subject to any disclaimer, the term of this patent is extended or adjusted under 35 U.S.C. 154(b) by 0 days.

(21) Appl. No.: 09/842,050

(22) Filed: Apr. 26, 2001

(65) Prior Publication Data

US 2001/0035130 A1 Nov. 1, 2001

(30) Foreign Application Priority Data

Apr. 27, 2000 (JP) ........................................ 2000-126949

(51) Int. Cl.$^7$ ............................. H05H 1/00; C23C 16/00
(52) U.S. Cl. ............................. 156/345.41; 156/345.42; 118/723 MW; 118/723 AN
(58) Field of Search ..................... 156/345.41, 345.42; 118/723 MW, 723 ME, 723 MA, 723 AN; 315/111.21, 111.71

(56) References Cited

U.S. PATENT DOCUMENTS

| 4,971,651 A | * | 11/1990 | Watanabe et al. ............. 216/67 |
| 5,866,986 A | * | 2/1999 | Pennington ............ 315/111.21 |
| 5,874,012 A | * | 2/1999 | Kanai et al. .................. 216/67 |

* cited by examiner

Primary Examiner—Gregory Mills
Assistant Examiner—P. Hassanzadeh
(74) Attorney, Agent, or Firm—Finnegan, Henderson, Farabow, Garrett & Dunner LLP

(57) ABSTRACT

A plasma processing apparatus includes a processing container whose interior has a mount table, a glass plate for covering an upper opening of the processing container, a microwave supplier, a coaxial waveguide having its end connected with the microwave supplier to have an inner conductor and an outer conductor, a radial waveguide box connected to the other end of the outer conductor of the coaxial waveguide to expand from the other end of the outer conductor outward in the radial direction and extend downward, a disc-shaped antenna member for covering a lower opening of the radial waveguide box having its central part connected with the other end of the inner conductor, and a metallic reflector on the opposite side of the antenna member's part connected with the inner conductor.

18 Claims, 3 Drawing Sheets

PLASMA PROCESSING APPARATUS

BACKGROUND OF THE INVENTION

1. Technical Field of the Invention

The present invention relates to a plasma processing apparatus utilizing a microwave.

2. Description of the Related Art

Conventionally, there is known a plasma processing apparatus which includes a plane antenna, as shown in FIG. 3.

This plasma processing apparatus 71 has a processing container 73 in the form of a bottomed pipe as a whole and a quartz plate 75 arranged on a ceiling part of the container 73 in an airtight manner, forming a closed processing space S inside the container 73. Accommodated in the processing container 73 is a mount table 77 which mounts a semiconductor wafer W thereon. The mount table 77 is connected with a bias high-frequency power source 79 through power lines. Through the sidewall of the container 73, a gas nozzle 81 is arranged to introduce process gas into the container 73 and further connected with a process gas source 83. Further, the container 73 is provided, in a bottom thereof, with exhaust ports 85 communicated with a not-shown vacuum pump.

While, a plane antenna member 87 is arranged on the quartz plate 75 closing up the top part of the processing container 73. The plane antenna member 87 is formed by a bottom plate of a radial waveguide box 89 and also attached to the top of the quartz plate 75. The radial waveguide box 89 is provided as a short, disc, hollow and cylindrical container. Connected with the top center of the disc radial waveguide box 89 is an outer tube 93A of a coaxial waveguide 93 which has the other end connected with a microwave generator 91. In the coaxial waveguide 93, an inner cable 93B is connected to the center of the disc-shaped antenna member 87.

The antenna member 87 is made from a copper plate and has a number of slots 95 formed therein. In order to shorten a wavelength of microwave thereby realizing a short guide-wavelength, the radial waveguide 89 fills its interior with a dielectric 97 of a predetermined dielectric constant.

In the constitution mentioned above, the microwave produced in the microwave generator 91 is propagated in the coaxial waveguide 93 and expands in the radial waveguide box 89 in the radial direction. Then, the microwave is emitted through the slots 95 of the antenna member 87 downwardly thereby to produce a plasma in the processing container 73.

In the above processing apparatus 71, however, an uneven electric field is formed below the plane antenna member 87, causing an unevenness in the processing for the wafer W. That is, the electric field emitted through the slots 95 of the antenna member 87 is reflected on the inside wall of the processing container 73 to intensify the electric field at the center of the container 73, as shown in a lower part of FIG. 3. Therefore, a problem arises in that an unevenness is produced in processing the wafers, particularly, large-diameter wafers.

SUMMARY OF THE INVENTION

In order to solve the above-mentioned problem, the object of the present invention is to provide a plasma processing apparatus which is capable of realizing a generally uniform electric field below the antenna member to accomplish an uniform wafer processing.

The first feature of the present invention resides in the provision of a plasma processing apparatus comprising: a processing container shaped to be a hollow cylinder with a bottom and also provided, inside thereof, with a mount table for mounting an object to be processed thereon; a lid body for covering an upper opening of the processing container in an airtight manner, the lid body having a dielectric; a microwave supplier for supplying a microwave; a waveguide having one end thereof connected to the microwave supplier, the waveguide extending from the microwave supplier toward the lid body and also having an waveguide space formed therein; a radial waveguide box connected to the other end of the waveguide, the radial waveguide box having a flange part expanding from the outer end of the waveguide outward in the radial direction and a sidewall extending from the flange part toward the lid body downward thereby to define a waveguide space therein; an antenna member for covering a lower opening of the radial waveguide box and having a plurality of slots formed therein, the antenna member being arranged in parallel with the lid body; and a metallic reflector formed at the center of the antenna member on the side of the mount table so as to extend toward the mount table, for reflecting a high-frequency electric field reflected by an inner wall of the processing container.

According to the second feature of the invention, the reflector is arranged to project from the lid body into the processing container.

According to the third feature of the invention, the reflector is arranged not to project from the lid body into the processing container.

According to the fourth feature of the invention, a tip of the reflector is embedded in the lid body.

According to the fifth feature of the invention, the reflector is shaped in a hollow cylinder or a pillar.

According to the sixth feature of the invention, the reflector is shaped in a hollow cylinder with circular sectional shape or a pillar with circular sectional shape.

According to the seventh feature of the invention, the reflector is shaped in a hollow cylinder with polygonal sectional shape or a pillar with polygonal sectional shape.

According to the eighth feature of the invention, in the plasma processing apparatus, an absorbing member is arranged close to the outer circumference of the radial waveguide box to absorb the high-frequency electric field.

According to the ninth feature of the invention, in the plasma processing apparatus, an absorbing member is arranged in the outer circumference of a space between a lower face of the antenna member and a lower face of the lid body having the dielectric.

According to the tenth feature of the invention, the waveguide includes an inner conductor and an outer conductor in coaxial with the inner conductor so that the microwave is propagated between the inner conductor and the outer conductor, an end of the outer conductor on the side of the lid body being connected with the radial waveguide, while an end of the inner conductor on the side of the lid body being connected with a central part of the antenna member.

According to the eleventh feature of the invention, the waveguide has circular sectional shape, microwave in TM mode being propagated therethrough.

The twelfth feature of the invention resides in the provision of another plasma processing apparatus comprising: a processing container shaped to be a hollow cylinder with a bottom and also provided, inside thereof, with a mount table for mounting an object to be processed thereon; a lid body for covering an upper opening of the processing container in an airtight manner, the lid body having a dielectric; a microwave supplier for supplying a microwave; a waveguide having one end thereof connected to the microwave supplier, the waveguide extending from the microwave supplier toward the lid body and also having an waveguide space formed therein; a radial waveguide box connected to the other end of the waveguide, the radial waveguide box having a flange part expanding from the other end of the waveguide outward in the radial direction and a sidewall extending from the flange part toward the lid body downward thereby to define an waveguide space therein; an antenna member for covering a lower opening of the radial waveguide box and having a plurality of slots formed therein, the antenna member being arranged in parallel with the lid body; and an absorber arranged at the central part of the antenna member on the side of the mount table so as to project toward the mount table, for absorbing the high-frequency electric field.

According to the thirteenth feature of the invention, in the above plasma processing apparatus, the absorber is arranged to project from the lid body into the processing container.

According to the fourteenth feature of the invention, the absorber is arranged not to project from the lid body into the processing container.

According to the fifteenth feature of the invention, a tip of the absorber is embedded in the lid body.

According to the sixteenth feature of the invention, the absorber is shaped in a hollow cylinder or a pillar.

According to the seventeenth feature of the invention, the absorber is shaped in a hollow cylinder with circular sectional shape or a pillar with circular sectional shape.

According to the eighteenth feature of the invention, the absorber is shaped in a hollow cylinder with polygonal sectional shape or a pillar with polygonal sectional shape.

According to the nineteenth feature of the invention, in the plasma processing apparatus, an absorbing member is arranged close to the outer circumference of the radial waveguide box to absorb the high-frequency electric field.

According to the twentieth feature of the invention, in the plasma processing apparatus, an absorbing member is arranged in the outer circumference of a space between a lower face of the antenna member and a lower face of the lid body having the dielectric.

According to the twenty-first feature of the invention, the waveguide includes an inner conductor and an outer conductor in coaxial with the inner conductor so that the microwave is propagated between the inner conductor and the outer conductor, an end of the outer conductor on the side of the lid body being connected with the radial waveguide, while an end of the inner conductor on the side of the lid body being connected with a central part of the antenna member.

According to the twenty-second feature of the invention, the waveguide has circular sectional shape, microwave in TM mode being propagated therethrough.

The above and other features and advantages of this invention will become apparent, and the invention itself will best be understood, from a study of the following description and appended claims, with reference had to the attached drawings showing preferred embodiments of the invention.

DESCRIPTION OF THE PREFERRED EMBODIMENT

Figure 1:
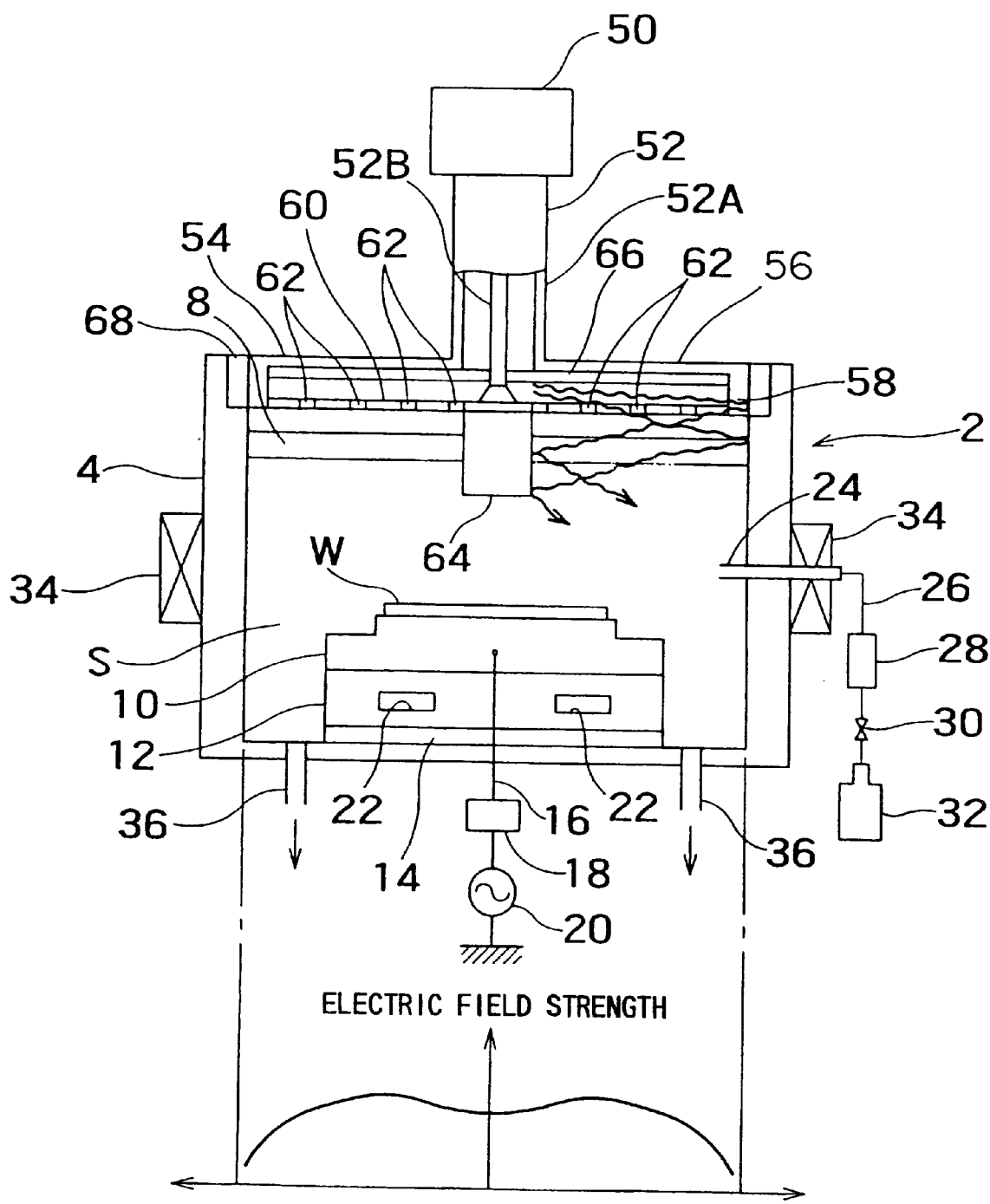
FIG. 1 is a longitudinal sectional view showing a plasma processing apparatus in accordance with the first embodiment of the present invention.
Figure 2:
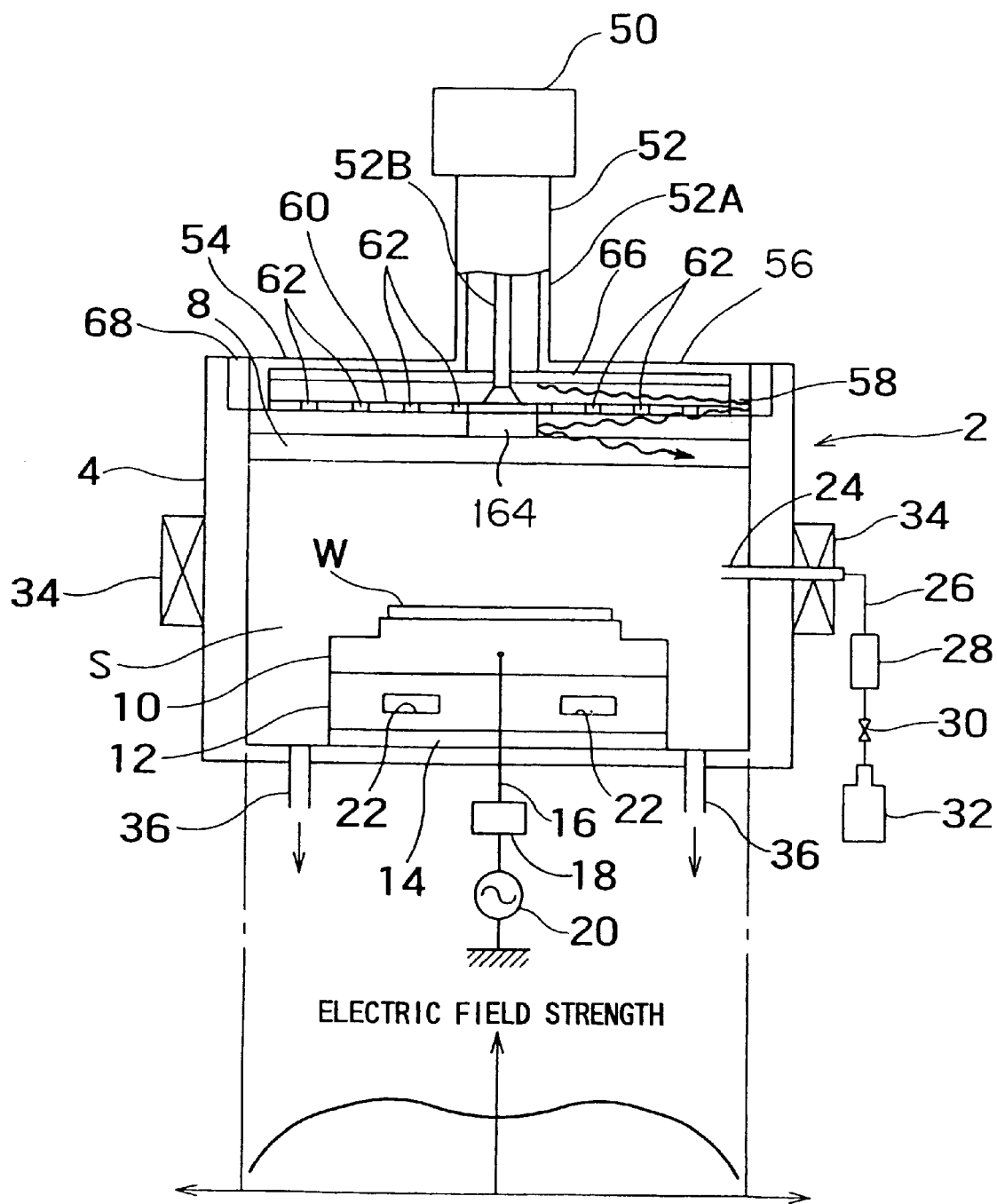
FIG. 2 is a longitudinal sectional view showing the plasma processing apparatus in accordance with the second embodiment of the present invention.
Figure 3:
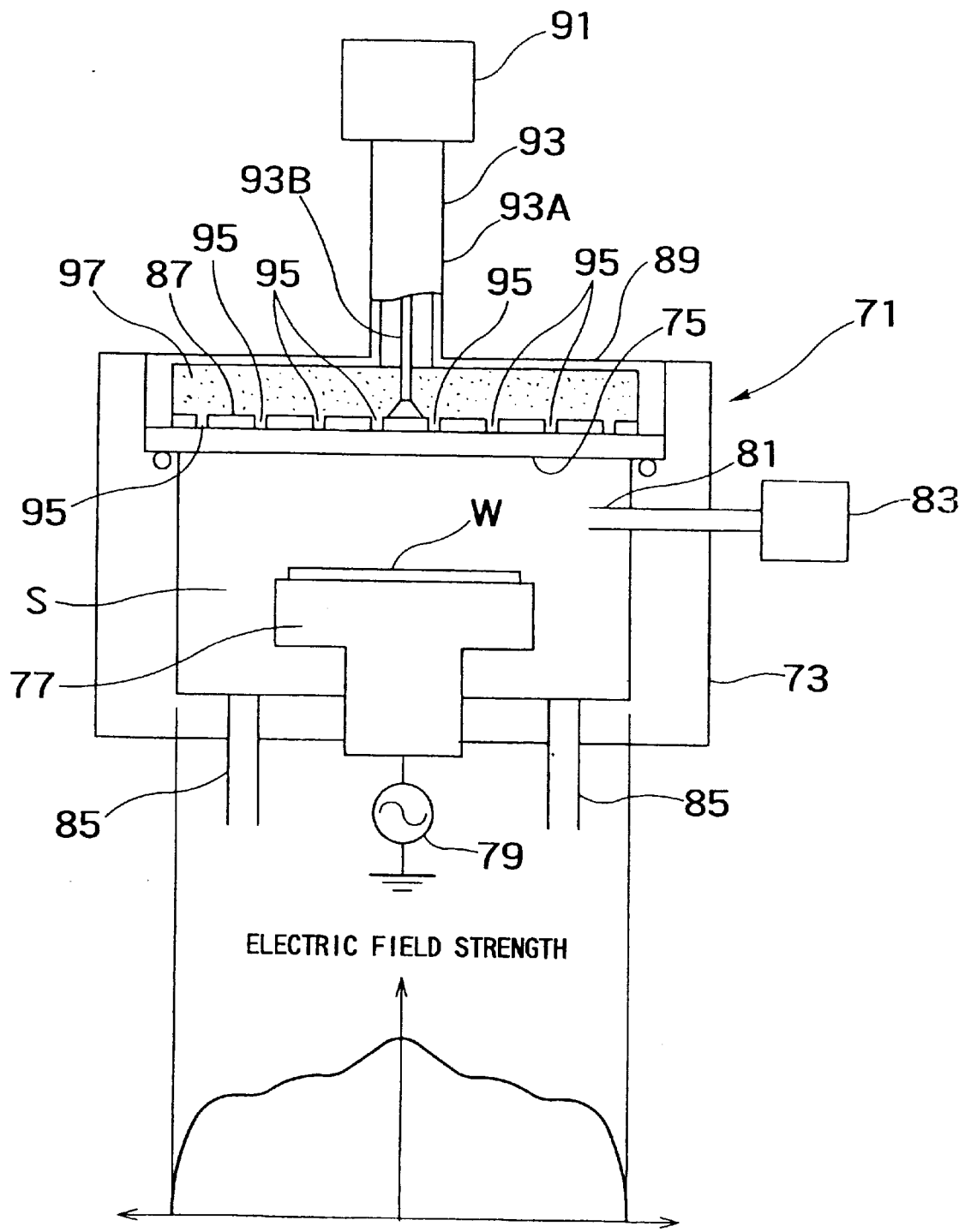
FIG. 3 is a longitudinal sectional view showing the conventional plasma processing apparatus.

With reference to FIGS. 1 and 2, embodiments of the present invention will be described below. Although the plasma processing apparatus is embodied by a plasma etching apparatus, the present invention is not limited to this application, of course.

FIG. 1 illustrates the first embodiment of the present invention. In this figures, the plasma etching apparatus 2 has a processing container 4 whose sidewall and bottom are together made of conductors, such as aluminum, and which is shaped to be a hollow cylinder with bottom, as a whole. Arranged on the upper part of an inside wall forming the container 4 is a glass plate 8 which has a thickness enough to endure a vacuum. The glass plate 8 is fitted to the container 4 in an airtight manner to define a closed processing space S therein.

In the processing container 4, there is accommodated a mount table 10 on which a semiconductor wafer W is mounted, as an object to be processed. The mount table 10 is provided in the form of a general column whosecentral part projects in plane. The mount table 10 is supported by a cradle 12 in the form of a column made of aluminum as well. The cradle 12 is arranged on the bottom inside the processing container 4 through an insulating material 14.

On the mount table 10, there are provided a not-shown electrostatic chuck, a clamp mechanism, etc. to hold the wafer W on the table 10. The mount table 10 is connected with a matching box 18 and a bias high-frequency power source 20. The cradle 12 supporting the mount table 10 is provided with cooling jackets 22 for feeding coolant for cooling the wafer at the plasma processing.

In the sidewall of the processing container 4, a gas supply nozzle 24 in the form of a quartz pipe is arranged to introduce an etching gas into the container 4. The nozzle 24 is connected to a processing-gas source 32 through a gas line 26 having a mass flow controller 28 and an valve 30 interposed therein.

On the periphery of the sidewall of the container 4, there is provided, along the circumferential direction, a magnetic field generator 34 which generates a magnetic field to shut plasma in the processing space S. For example, an electromagnetic coil, permanent magnets or the like does constitute the magnetic field generator 34. Note, as the magnetic field generator 34 is not always necessary in view of generating the plasma, the generator 34 may be eliminated according to circumstances.

The processing container 4 is provided, on a bottom thereof, with exhaust ports 36 which are connected to a not-shown vacuum pump, allowing the interior of the container 4 to be evacuated to a predetermined pressure as occasion demands.

A microwave generator 50 is arranged above the glass plate 8 of the processing container 4. The microwave generator 50 is connected to a coaxial waveguide 52. The coaxial waveguide 52 has an outer conductor 52A in the form of a pipe and an inner conductor 52B disposed in the outer conductor 52A coaxially. In operation, the "TEM-mode" microwave originating in the microwave generator 50 is propagated between the outer conductor 52A and the inner conductor 52B. A radial waveguide box 54 is connected with the outer conductor 52A of the coaxial waveguide 52. The radial waveguide box 54 has a flange part 56 expanding outward in the radial direction from the lower end of the outer conductor 52A and a sidewall 58 extending from the outer periphery of the flange part 56 toward the glass plate 8 downwardly. To a lower opening of the radial waveguide box 54, a disc-shaped antenna member 60 is fitted so as to cover the lower opening of the radial waveguide box 54, defining a waveguide space therein. The antenna member 60 is made of a copper plate and has a number of slots 62 formed therein. The slots 62 are arranged from the plate center toward the periphery in a spiral manner. In the radial waveguide box 54, the inner conductor 52B is connected with the center of the antenna member 60. On the opposite side of the part of the member 60 in connection with the inner conductor 52B, namely, the side of the mount table 10, a metallic cylindrical reflector 64 is arranged so as to project toward the mount table 10. The cylindrical reflector 64 passes through the glass plate 8 to project into the processing container 4. The reflector 64 serves to reflect a high-frequency (microwave) electric field, which has been reflected by the inner wall of the container 4, outward again.

A space defined by the radial waveguide box 54 and the disc-shaped antenna member 60 is filled up with a dielectric material 66. Further, on the outer circumference of the sidewall 58 of the radial waveguide 54, an absorbing member 68 for absorbing the high-frequency (microwave) electric field is arranged in order to prevent the reflection of the electromagnetic field to some degree.

Next, the operation of the apparatus constructed above will be described. First, the semiconductor wafer W is accommodated in the processing container 4 through a not-shown gate valve by a transfer arm. Next, by moving lifer pins (not shown) up and down, the wafer w is mounted on the upper face of the mount table 10. Subsequently, while maintaining the processing container 4 of a predetermined pressure, the gas supply nozzle 24 supplies the container with etching gas whose flow rate is being controlled. Simultaneously, the microwave from the microwave generator 50 is introduced into the processing space S to produce plasma for etching. In connection, when applying the bias high-frequency power on the mount table 10, it is possible to produce a negative electrical potential on the mount table 10, accomplishing the extraction of ions from plasma effectively. It is noted that the magnetic field generator 34 on the sidewall of the processing container 4 is provided to generate a magnetic field to shut plasma in the container 4. Therefore, even if no magnetic field generator is provided, the production of plasma could be ensured by the microwave from the disc-shaped antenna member 60.

In the constitution mentioned above, the TEM-mode microwave generated from the microwave generator 50 is propagated through the coaxial waveguide 52 to reach its connecting part with the radial waveguide box 54. Then, the microwave is propagated from the connecting part to the periphery of the radial waveguide box 54. The microwave propagated toward the periphery of the radial waveguide box 54 passes through the disc-shaped antenna member 60 and emits an electromagnetic field into the processing space beneath the member 60, so that plasma is produced by this electromagnetic field. Hereat, the electromagnetic field emitted from the lower face of the disc-shaped antenna member 60 is reflected on the inside wall of the processing container 4 to concentrate at the center of the processing space S. Nevertheless, the plasma processing apparatus of the embodiment is provided, on the opposite side of the antenna member's part in connection with the inner conductor 52B, with the metallic reflector 64 projecting toward the mount table 10. Accordingly, the apparatus of the embodiment is capable of reflecting the high-frequency (microwave) electric field concentrating in the center of the processing space S as a result of reflection, outward again. Therefore, the intensity of an electromagnetic field in the space S below the disc-shaped antenna member 60 is equalized as shown in the lower graph of FIG. 1. Thus, it is possible to produce even and uniform plasma covering a wide range, whereby even a large-sized wafer can be subjected to an even processing in its plane.

As mentioned above, in the plasma processing apparatus, there are provided the processing container 4 shaped to be a cylinder with a bottom and also provided, an inside thereof, with the mount table 10 for mounting the object W to be processed thereon; the glass plate 8 for covering the upper opening of the processing container 4 in an airtight manner; the microwave supplier 50; the waveguide 52 having the inner conductor 52B and the outer conductor 52A in coaxial with the inner conductor 52B, the waveguide 52 being adapted so that the microwave is propagated between the inner conductor 52B and the outer conductor 52A; the radial waveguide box 54 connected to the other end of the outer conductor 52A of the waveguide 52, the radial waveguide box 54 expanding from the other end of the outer conductor 52A outward in the radial direction in the form of a flange and subsequently extending toward the glass body 8 downward as a sidewall thereby forming a waveguide space therein; the disc-shaped antenna member 60 covering the lower opening of the radial waveguide box 54 and having its center connected with the other end of the inner conductor 52B, the antenna member 60 having a plurality of slots 62 formed therein and being arranged in parallel with the glass plate 8; and the metallic reflector 64 projecting toward the mount table 10 on the opposite side of the antenna member's part in connection with the inner conductor 52B thereby to reflect an electric field upon reflection on the inner wall of the container 4. With the constitution mentioned above, it is possible to reflect the high-frequency (microwave) electric field concentrating in the center of the processing space S as a result of reflection, outward again, whereby the intensity of an electromagnetic field in the processing space S can be equalized below the disc-shaped antenna member 60. Therefore, it is possible to produce even and uniform plasma covering a wide range, whereby even a large-sized wafer can be subjected to an even processing in its plane.

Although the metallic cylindrical reflector 64 is arranged on the opposite side of the disc-shaped antenna member's (60) part connecting with the inner conductor 52B in the above-mentioned embodiment, the present invention is not limited to only the above arrangement. For example, in the modification, the reflector 64 may be replaced by a cylindrical absorber (high resistor) which is arranged to extend toward the mount table 10 through the glass plate 8 and also project into the processing container 4, for absorbing the high-frequency (microwave) electric field reflected by the inner wall of the container 4. With this arrangement, since the high-frequency (microwave) electric field reflected by the inner wall of the container 4 can be absorbed at the center of the processing space S, it is possible to prevent the electromagnetic field from concentrating in the center of the space S, accomplishing the formation of uniform electromagnetic field. Consequently, the apparatus of the embodiment allows the uniform plasma to be produced in the processing container S, whereby the uniform wafer processing can be realized. As the cylindrical absorber, material exhibiting high plasma-resistant characteristics and no possibility of contamination, such as single-crystal silicon, is recommended in view of the arrangement of projecting into the processing container 4.

FIG. 2 illustrates the second embodiment of the present invention. This embodiment differs from the first embodiment of FIG. 1 in that a metallic cylindrical reflector 164 is arranged so as to extend from the central part of the disc-shaped antenna member 60 toward the mount table 10 and up to the inside of the glass plate 8 without exposing itself into the processing container 4. In such a structure as well, it is possible to reflect the high-frequency (microwave) electric field, which has been reflected by the inner wall of the container 4, outward again. Therefore, it is possible to equalize the intensity of an electromagnetic field below the disc-shaped antenna member 60 in the processing space S, allowing even and uniform plasma to be produced covering a wide range. Additionally, owing to the arrangement that the cylindrical reflector 164 is not exposed to the interior of the processing container 4, it is possible to prevent the deposition or adhesion of metals on the reflector, abolishing an operator's surplus work to clean the reflector.

Although the metallic cylindrical reflector 164 is arranged at the center of the disc-shaped antenna member 60 in the second embodiment, the present invention is not limited to only this arrangement. For example, in the modification, the reflector 164 may be replaced by a cylindrical absorber (high resistor) which is arranged to extend toward the mount table 10 and up to the inside of the glass plate 8, for absorbing the high-frequency (microwave) electric field reflected by the inner wall of the container 4. With this arrangement, since the high-frequency (microwave) electric field reflected by the inner wall of the container 4 can be absorbed at the center of the processing space S, it is possible to prevent the electromagnetic field from concentrating in the center of the space S, accomplishing the formation of uniform electromagnetic field. Consequently, the apparatus of the embodiment allows the uniform plasma to be produced in the processing container S, whereby the uniform wafer processing can be realized.

With respect to the second embodiment shown in FIG. 2, both cylindrical reflector 164 and absorber are extending to such a extent that the distal end of the reflector or absorber is contact with the inside or the upper side of the glass plate 8. However, there is no need to define a reflector or an absorber into these examples shown in FIG. 2. The cylindrical reflector or absorber may be embedded in the glass plate 8, as long as the reflector or absorber does not expose from the undersurface of the glass plate 8 to the processing space S. Adopting these cylindrical reflector or absorber embedded into the glass plate 8 for the apparatus, it is possible to reflect or absorb the electromagnetic wave transferring through the glass plate 8 by the part of the reflector or absorber embedded in the glass plate 8, as well as to prevent metal etc. from being deposited on or adhering to the reflector or absorber. Therefore, it is possible to create uniform plasma in the processing space S and carry out uniform processing for wafer.

Note, although the reflector and the absorber arranged on the opposite side of the antenna member's (60) part connected with the inner conductor 52B are respectively formed to be cylinders, they may be shaped in the form of polygonal pipes, columns or polygonal pillars, in the modification.

Although there is adopted the coaxial waveguide 52 as a waveguide in common with the first and second embodiments, it may be replaced by a cylindrical waveguide where the TM-mode microwave is propagated.

Besides etching, the plasma processing apparatus of the invention is also applicable to other processing, for example, a film-deposition process, a film-quality improvement process, etc. Furthermore, besides wafers, the present plasma processing apparatus is applicable to process flat panel display substrates etc.

As mentioned above, according to the invention, the plasma processing apparatus comprises the processing container shaped to be a hollow cylinder with a bottom and also provided, an inside thereof, with the mount table for mounting an object to be processed thereon; the lid body for covering an upper opening of the processing container in an airtight manner, the lid body having a dielectric, the microwave supplier for supplying the microwave; the waveguide having one end thereof connected to the microwave supplier, the waveguide extending from the microwave supplier toward the lid body and also having the waveguide space formed therein; the radial waveguide box connected to the other end of the waveguide, the radial waveguide having the flange part expanding from the other end of the waveguide outward in the radial direction and the sidewall extending from the flange part toward the lid body downward thereby forming the waveguide space therein; the antenna member for covering a lower opening of the radial waveguide box and having a plurality of slots formed therein, the antenna member being arranged in parallel with the lid body; and the metallic reflector (or absorber) formed at the center of the antenna member on the side of the mount table so as to extend toward the mount table, for reflecting (or absorbing) the high-frequency electric field reflected by the inner wall of the processing container. That is, owing to the provision of the reflector or the absorber, it is possible to equalize the intensity of electromagnetic field in the processing space below the antenna member. Consequently, it is possible to produce the uniform plasma covering a wide area, accomplishing the even processing on the substrates, such as wafers.

What is claimed is:

1. A plasma processing apparatus comprising:
   a processing container shaped to be a hollow cylinder with a bottom and having a container center, and also provided, inside thereof, with a mount table for mounting an object to be processed thereon;
   a lid body for covering an upper opening of the processing container in an airtight manner, the lid body having a dielectric;
   a microwave supplier for supplying a microwave;
   a waveguide having one end thereof connected to the microwave supplier, the waveguide extending from the microwave supplier toward the lid body and also having a waveguide space formed therein;
   a radial waveguide box connected to the other end of the waveguide, the radial waveguide box having a flange part expanding from the outer end of the waveguide outward in the radial direction and a sidewall extending from the flange part toward the lid body downward thereby to define a waveguide space therein;
   an antenna member for covering a lower opening of the radial waveguide box and having a plurality of slots formed therein, the antenna member being arranged in parallel with the lid body and having an antenna member center; and
   a metallic reflector formed at the center of the antenna member on the side of the mount table so as to extend toward the mount table, for reflecting a high-frequency electric field reflected by an inner wall of the processing container and to prevent the field from concentrating in the container center.

2. A plasma processing apparatus as claimed in claim 1, wherein
the reflector is arranged to project from the lid body into the processing container.

3. A plasma processing apparatus as claimed in claim 1, wherein
the reflector is shaped in a hollow cylinder or a pillar.

4. A plasma processing apparatus as claimed in claim 1, wherein
the reflector is shaped in a hollow cylinder with circular sectional shape or a pillar with circular sectional shape.

5. A plasma processing apparatus as claimed in claim 1, wherein
the reflector is shaped in a hollow cylinder with polygonal sectional shape or a pillar with polygonal sectional shape.

6. A plasma processing apparatus as claimed in claim 1, further comprising an absorbing member which is arranged close to the outer circumference of the radial waveguide box to absorb the high-frequency electric field.

7. A plasma processing apparatus as claimed in claim 1, further comprising an absorbing member which is arranged in the outer circumference of a space between a lower face of the antenna member and a lower face of the lid body having the dielectric.

8. A plasma processing apparatus as claimed in claim 1, wherein
the waveguide includes an inner conductor and an outer conductor in coaxial with the inner conductor so that the microwave is propagated between the inner conductor and the outer conductor, an end of the outer conductor on the side of the lid body being connected with the radial waveguide, while an end of the inner conductor on the side of the lid body being connected with a central part of the antenna member.

9. A plasma processing apparatus as claimed in claim 1, wherein
the waveguide has circular sectional shape, microwave in TM mode being propagated therethrough.

10. A plasma processing apparatus comprising:
a processing container shaped to be a hollow cylinder with a bottom and having a container center, and also provided, inside thereof, with a mount table for mounting an object to be processed thereon;
a lid body for covering an upper opening of the processing container in an airtight manner, the lid body having a dielectric;
a microwave supplier for supplying a microwave;
a waveguide having one end thereof connected to the microwave supplier, the waveguide extending from the microwave supplier toward the lid body and also having a waveguide space formed therein;
a radial waveguide box connected to the other end of the waveguide, the radial waveguide box having a flange part extending from the outer end of the waveguide outward in the radial direction and a sidewall extending from the flange part toward the lid body downward thereby to define a waveguide space therein;
an antenna member for covering a lower opening of the radial waveguide box and having a plurality of slots formed therein, the antenna member being arranged in parallel with the lid body and having an antenna member center; and
an absorber arranged at the center of the antenna member on the side of the mount table so as to project toward the mount table, for absorbing the high-frequency electric field and to prevent the field from concentrating in the container center.

11. A plasma processing apparatus as claimed in claim 10, wherein
the absorber is arranged to project from the lid body into the processing container.

12. A plasma processing apparatus as claimed in claim 10, wherein
the absorber is shaped in a hollow cylinder or a pillar.

13. A plasma processing apparatus as claimed in claim 10, wherein
the absorber is shaped in a hollow cylinder with circular sectional shape or a pillar with circular sectional shape.

14. A plasma processing apparatus as claimed in claim 10, wherein
the absorber is shaped in a hollow cylinder with polygonal sectional shape or a pillar with polygonal sectional shape.

15. A plasma processing apparatus as claimed in claim 10, further comprising an absorbing member which is arranged close to the outer circumference of the radial waveguide box to absorb the high-frequency electric field.

16. A plasma processing apparatus as claimed in claim 10, further comprising an absorbing member which is arranged in the outer circumference of a space between a lower face of the antenna member and a lower face of the lid body having the dielectric.

17. A plasma processing apparatus as claimed in claim 10, wherein
the waveguide includes an inner conductor and an outer conductor in coaxial with the inner conductor so that the microwave is propagated between the inner conductor and the outer conductor, an end of the outer conductor on the side of the lid body being connected with the radial waveguide, while an end of the inner conductor on the side of the lid body being connected with a central part of the antenna member.

18. A plasma processing apparatus as claimed in claim 10, wherein
the waveguide has circular sectional shape, microwave in TM mode being propagated therethrough.

* * * * *